United States Patent
Mantegazza et al.

(10) Patent No.: US 10,957,387 B1
(45) Date of Patent: Mar. 23, 2021

(54) MULTI-LEVEL CELL (MLC) TECHNIQUES AND CIRCUITS FOR CROSS-POINT MEMORY

(71) Applicant: Intel Corporation, Santa Clara, CA (US)

(72) Inventors: Davide Mantegazza, Palo Alto, CA (US); Kiran Pangal, Fremont, CA (US); Sanjay Rangan, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/687,468

(22) Filed: Nov. 18, 2019

(51) Int. Cl.
*G11C 11/00* (2006.01)
*G11C 11/56* (2006.01)
(Continued)

(52) U.S. Cl.
CPC ...... *G11C 11/5678* (2013.01); *G11C 13/0004* (2013.01); *G11C 13/004* (2013.01); *G11C 13/0069* (2013.01); *H01L 27/2463* (2013.01); *H01L 45/06* (2013.01); *G11C 2013/005* (2013.01); *G11C 2013/0078* (2013.01); *G11C 2213/15* (2013.01); *G11C 2213/52* (2013.01); (Continued)

(58) Field of Classification Search
CPC .......... G11C 13/004; G11C 11/16; G11C 2013/0057; G11C 11/5685; G11C 13/0007; G11C 2213/32; G11C 2013/0054; G11C 2211/5634; G11C 2213/31; G11C 2213/34; G11C 2213/77; G11C 11/5678; G11C 13/0004; G11C 13/0069; G11C 2013/0078

USPC .......... 365/185.03, 185.12, 185.17
See application file for complete search history.

(56) References Cited

U.S. PATENT DOCUMENTS

2020/0082880 A1 * 3/2020 Inuzuka ............ G11C 13/003

OTHER PUBLICATIONS

El-Hassan et al, "Implementation of time-aware sensing technique for multilevel phase change memory cell", Elsevier Microelectronics Journal 56, Feb. 23, 2016, 7 pages.
(Continued)

*Primary Examiner* — Thong Q Le
(74) *Attorney, Agent, or Firm* — Compass IP Law, PC

(57) ABSTRACT

Techniques for accessing multi-level cell (MLC) crosspoint memory cells are described. In one example, a circuit includes a crosspoint memory cell that can be in one of multiple resistive states (e.g., four or more resistive states). In one example, to perform a read, circuitry coupled with the memory cell applies one or more sub-reads at different read voltages. For example, the circuitry applies a first read voltage and detects if the memory cell thresholds in response to the first read voltage. If the memory cell thresholded in response to the first read voltage, the state of the memory cell can be determined without further reads. If the memory cell did not threshold in response to the first read voltage, a second read voltage with a greater magnitude is applied across the memory cell. If the memory cell thresholded in response to the second read voltage, the state of the memory cell can be determined without further reads. If the memory cell did not threshold in response to the first read voltage, a third read voltage with a greater magnitude is applied across the memory cell. In one example, the thresholding of the memory cell triggers the application of a write current to write back the state of the bit due to read disturb from the read.

17 Claims, 7 Drawing Sheets

(51) Int. Cl.
*G11C 13/00* (2006.01)
*H01L 45/00* (2006.01)
*H01L 27/24* (2006.01)

(52) U.S. Cl.
CPC ...... *G11C 2213/73* (2013.01); *H01L 45/1233* (2013.01); *H01L 45/1253* (2013.01); *H01L 45/143* (2013.01); *H01L 45/144* (2013.01)

(56) References Cited

OTHER PUBLICATIONS

Pantazi et al, "Multilevel Phase-Change Memory Modeling and Experimental Characterization", E\PCOS Conference, Sep. 2009, 8 pages.
Papandreou et al, "Drift-Tolerant Multilevel Phase-Change Memory", 3rd IEEE International Memory Workshop (IMW), May 22-25, 2011, 4 pages.
Pozidis et al, "Enabling Technologies for Multilevel Phase-Change Memory" Semantic Scholar, IBM Research, Zurich, Switzerland, Sep. 2011, 8 pages.

\* cited by examiner

US 10,957,387 B1

MULTI-LEVEL CELL (MLC) TECHNIQUES AND CIRCUITS FOR CROSS-POINT MEMORY

FIELD

The descriptions are generally related to memory, and more particularly, to techniques for multi-level cell (MLC) nonvolatile memory, such as cross-point memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1A:
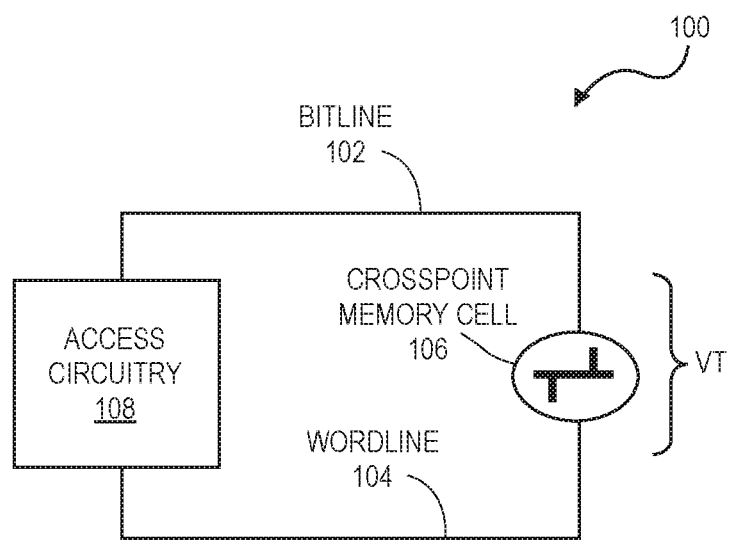
FIG. 1A is an example of a memory cell.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for accessing multi-level cell (MLC) crosspoint memory are described herein.

Conventional crosspoint memories include memory cells that are programmable to one of two states to store one bit. In contrast to conventional crosspoint memory, an MLC crosspoint memory includes cells that are programmable to more than two states, and therefore can store multiple bits. For example, an MLC crosspoint memory can include a storage material that can be in one of four states (to store 2 bits) or more.

Prior attempts at developing a MLC crosspoint memory have been generally unsuccessful due to the challenges faced. Techniques for writing to and reading from MLC crosspoint memory have resulted in high error rates. One prior technique for attempting to read a MLC crosspoint cell involves applying a single sub-threshold voltage across the cell. A sub-threshold voltage is a voltage that is lower than any threshold voltage of the cell. Thus, the read operation does not cause the storage material of the cell to experience a threshold event and is therefore unlikely to cause read disturb. In one such scheme, after applying a sub-threshold voltage, the resistance of the cell can then be determined by detecting the current flowing through the cell. However, the difference between the expected current flowing through the cell in response to the sub-threshold voltage for different resistive states is very small. Therefore, correctly determining the resistive state is difficult and the error rate is high.

In contrast, reading an MLC crosspoint cell with multiple voltage pulses that are above threshold voltages of the cell enable faster and more accurate results. For example, a 2-bit memory cell with four states can be read by applying three read voltages. After application of each read voltage, it is determined whether the cell thresholds. If the cell thresholds after a read voltage, the value stored by the cell can be determined and the operation can end. If the cell does not threshold after a read voltage, then the next read voltage with a higher magnitude is applied to the cell. Thus, one of multiple read voltage are applied depending on the output of the cell in response to the previous read voltage. After a read voltage causes a cell to threshold, a program current can be applied to bring the cell back to the previous state. Thus, each read operation for a two-bit memory cell includes up to 3 consecutive sub-reads, done at 3 different read biases. Each sub-read may also enable a write-back operation to ensure read-disturb immunity. Accordingly, the read technique enables crosspoint memory to be used for higher density applications (e.g., 2x higher density for a 2-bit cell) without high read error rates. A similar or same technique can be applied for memory cells storing more than two bits (e.g., 3 bits, 4 bits, or more).

FIG. 1A is circuit diagram of an example of a two-terminal crosspoint memory cell. The crosspoint memory cell is one of many memory cells in a crosspoint memory device. The crosspoint memory cell 106 is coupled with access circuitry via a bitline 102 and a wordline 104. The crosspoint memory cell 106 includes a material to store one or more bits. The memory element of the crosspoint memory cell 106 can include any memory element with a tunable threshold voltage. In one example, the cell 106 can be in one of multiple (e.g., 2, 4 or more) resistive states. In one such example, each different resistive state is associated with a different threshold voltage (VT). A threshold voltage is a voltage at which the cell 106 undergoes a change (e.g., a physical change) that causes the cell to be in a higher conductive state. In one example, a memory cell can be said to "threshold" or undergo a "threshold event." In one example, when a memory cell thresholds (e.g., in response to an applied voltage with a magnitude greater than the threshold voltage at the current state), the memory cell undergoes a physical change that causes the memory cell to exhibit a certain electrical characteristics, such as high conductivity. Once a cell thresholds, a program current of a particular amplitude, polarity, and duration can be applied to the cell to cause the cell to be in the desired resistive state. The value stored by the crosspoint memory cell 106 can therefore be determined by detecting the resistive state of the cell, which can be determined by detecting the current that flows through the cell in response to an applied voltage.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells.

Figure 1B:
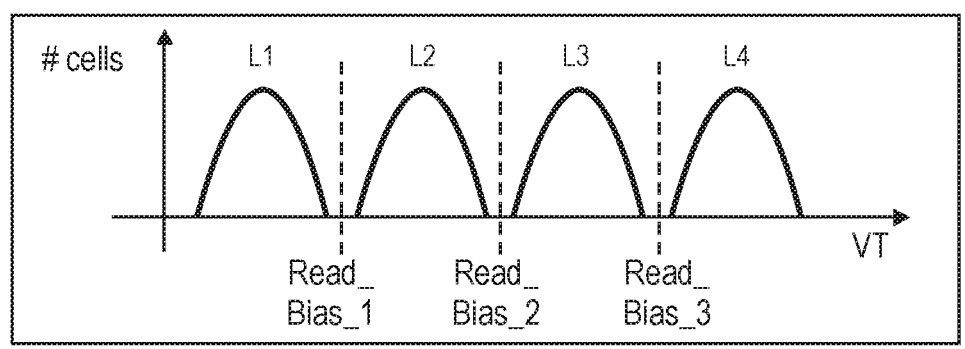
FIG. 1B illustrates an example of threshold voltage distributions for a MLC crosspoint memory cell.

FIG. 1B illustrates an example of threshold voltage distributions for the memory cell 106 of FIG. 1A. FIG. 1B shows in an example in which the memory cell can be in one of four states or programming levels (e.g., L1, L2, L3, and L4). Although different states are referred to herein as L1, L2, L3, and L4, other labels may be used to identify different states or programming levels. Each of the states) has a different threshold voltage distribution. The read voltages are selected to be between adjacent threshold voltage distributions. For example, READ_BIAS_1 is between the threshold voltage distributions for states L1 and L2. READ_BIAS_2 is between the threshold voltage distributions for states L2 and L3. READ_BIAS_3 is between the threshold voltage distributions for states L3 and L4. By applying the voltage READ_BIAS_1 across the memory cell, cells in state L1 would threshold, but cells in states L2, L3, and L4 would not threshold. Applying the voltage READ_BIAS_2 would cause cells in states L1 and L2 to threshold, but not cells in states L3 and L4. Applying the voltage READ_BIAS_3 would cause cells in states L1, L2, and L3 to threshold, but not cause cells in state L4 to threshold. Thus, the second read voltage has a larger magnitude than the first read voltage, and the third read voltage has a larger magnitude than the second read voltage. In one example, one or more of the read voltages have magnitudes that cause the memory cell to threshold. In one such example, all the read voltages have magnitudes sufficient to cause the memory cell to threshold. In this example, all the read voltages have magnitudes less than the write bias magnitude.

Consider an example in which the memory cell 106 includes a phase change storage material. In one such example, the distributions L1-L4 may represent varying levels of crystallinity or amorphousness. For example, the storage material may include a phase change material to be in one of four states having varying degrees of amorphousness or crystallinity. For example, the distribution L1 may represent the VT distribution for a storage element that is fully crystalline. Distributions L2, L3 and L4 may represent increasing amorphous fractions inside the storage element, achieved by applying different programming currents.

In one example, the memory cell 106 includes both a phase change storage material and a non-phase change selector material. In one such example, the selector material is capable of being in two or more states. For example, states L1 and L2 can represent two states of the selector material and states L3 and L4 can represent two state of the phase change storage material. In another example with a selector device, the selector device does not store data and states L1-L4 represent different states of the phase change material. In an example in which the memory cell 106 does not include a phase change storage material, the distributions for L1-L4 may represent different resistive or conductive states. Note that the example of FIG. 1B illustrates four states, however, the techniques described herein can be extended to more than four states (e.g., eight states, etc.).

Figure 1C:
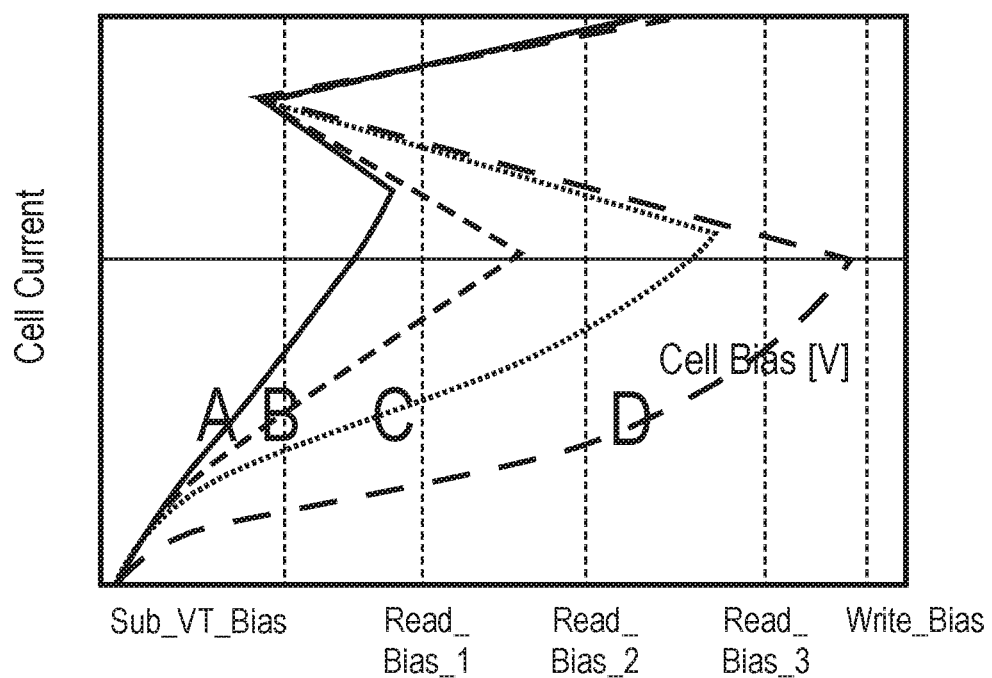
FIG. 1C is a graph illustrating an example of I-V curves (current-voltage characteristic curves) for a crosspoint memory cell in different states.

FIG. 1C is a graph illustrating an example of I-V curves (current-voltage characteristic curves) for a crosspoint memory cell in different states. Specifically, the graph of FIG. 1C shows I-V curves A, B, C, and D for the memory cell 106 in states L1, L2, L3, and L4, respectively. Given the programming I-VT characteristic of each cell, MLC capability can be achieved by programming the cell into four different states. In this example, each I-V curve is approximately linear up until the threshold voltage. Once the threshold voltage is reached, there is a "snapback" or threshold event in which the cell enters a higher conductive state. To program a memory cell, typically a voltage (shown as Write_Bias in FIG. 1C) that is higher than the threshold voltages in all states is applied to ensure the cell thresholds. Once the cell thresholds in response to the application of Write_Bias, a program current is applied to program the cell to the desired state.

To read the cell, unlike prior MLC read techniques involving sub-threshold voltages (e.g., voltages at or below Sub_Vt_Bias), one or more read voltages (READ_BIAS_1, READ_BIAS_2, and READ_BIAS_3) with magnitudes greater than threshold voltages are applied across the cell.

Figure 2:
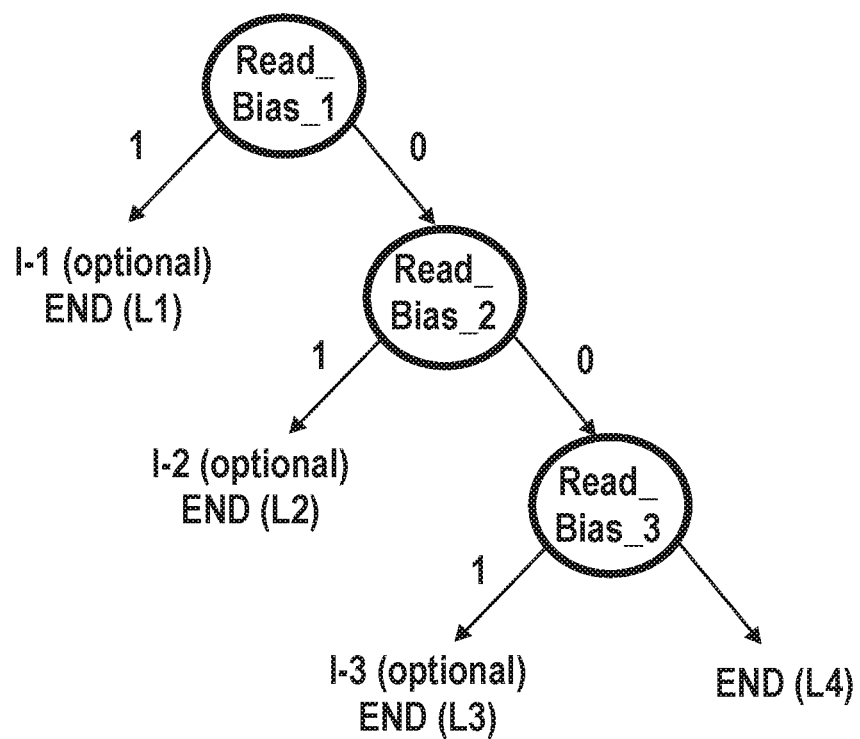
FIG. 2 illustrates an example of a technique for reading an MLC crosspoint memory cell.

FIG. 2 illustrates an example of a technique for reading an MLC crosspoint memory cell.

The technique begins with a read at a first read voltage, READ_BIAS_1. In this example, if the cell thresholds ("1") during the first read at READ_BIAS_1, the read-operation ends because the status of the cell is determined to be L1. In some examples, the threshold event potentially causes read-disturb. Therefore, a write-back repair current (I-1) is applied with the first read operation if the cell thresholds (e.g., "1" is detected). Note that the program current I-1 is indicated as optional. In some crosspoint memory architectures, the application of READ_BIAS_1 may not disturb the value stored in the memory cell, and therefore not require a write back current. In one such example, the voltage READ_BIAS_1 can be selected to be below the threshold voltages of the memory element (for example, if the states A and B are states of an amorphous selector element, then READ_BIAS_1 may not be disruptive).

If during the first read at READ_BIAS_1, no threshold is detected ("0"), then state "L1" can be excluded and a second read at a higher bias READ_BIAS_2 is applied. In this example, if a threshold event is detected at READ_BIAS_2 ("1"), the state of the cell is determined to be L2. In one example, the threshold event at READ_BIAS_2 is likely to cause read-disturb, potentially moving the VT of the cell into the L1, L3, or L4 distributions. Thus, a program current I-2 is also applied with the second read operation if the cell thresholds to bring back the cell in state L2. However, the current I-2 is also indicated to be optional because some crosspoint memory architectures may not experience disturbance from the application of READ_BIAS_2. If no threshold event is detected during the second read at READ_BIAS_2 read ("0") the bit will be in state L3 or L4. To determine which state of the two (L3 or L4) the memory cell is in, a final third read at READ_BIAS_3 is applied. If during this third read at READ_BIAS_3 a threshold event is detected ("1") the read operation ends, and the cell is determined to be in state L3. Also, the I-3 current may or may not be applied to avoid any residual read-disturb problem, as previously described. If during this third read at READ_BIAS_3, no threshold is detected ("0"), the read ends and the cell is determined to be in state L4. In this last case, there is no need to apply any repair current since no threshold event occurred.

Figure 3:
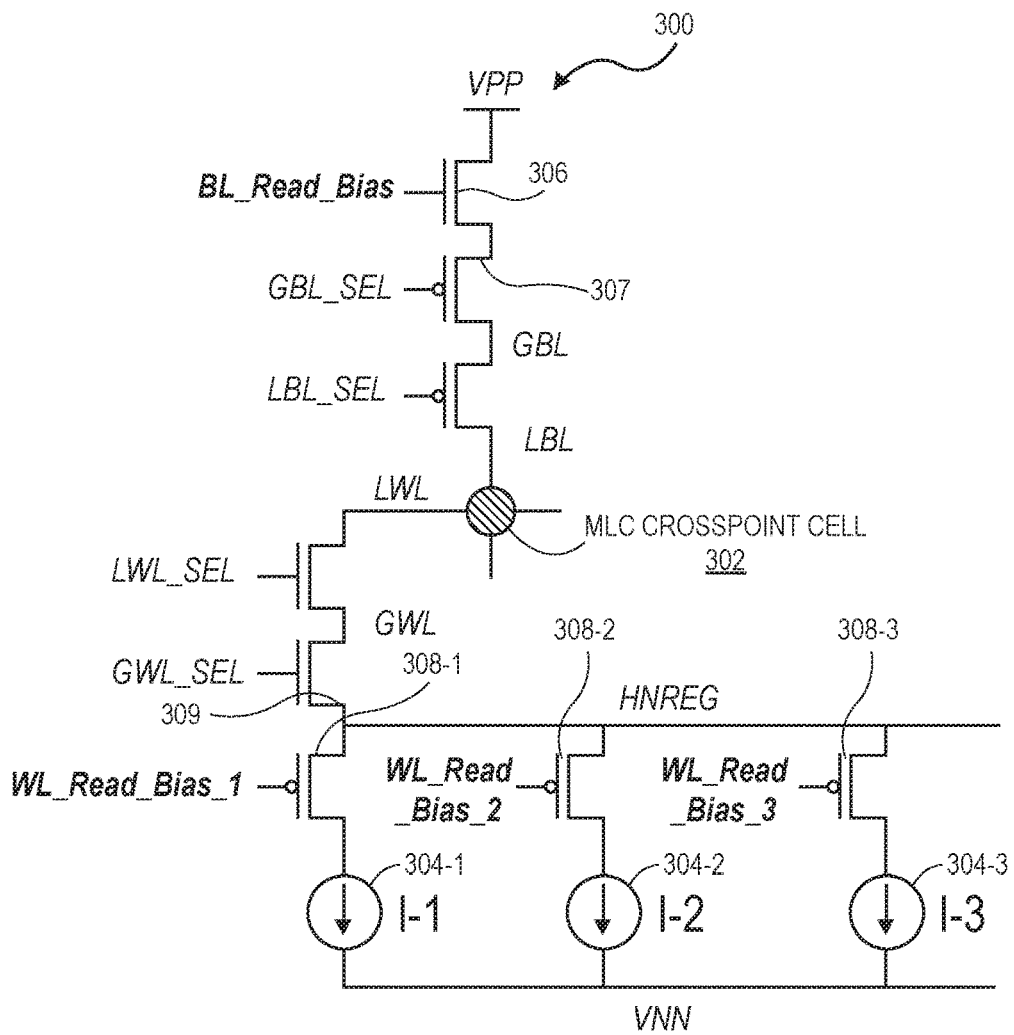
FIG. 3 illustrates an example of a circuit topology with a MLC crosspoint memory cell.

FIG. 3 illustrates an example of a circuit topology with a MLC crosspoint memory cell. The circuit 300 includes a single memory cell 302. The memory cell 302 is an MLC crosspoint memory cell that can be the same as, or similar to, the cell 106 described above with respect to FIG. 1. In the illustrated example, the memory cell 302 has one terminal that is coupled with the supply voltage VPP and another terminal that is coupled with the supply voltage VNN. In this example, VPP is on the bitline side and VNN is on the wordline side, so the supply voltages could alternatively be referred to as bitline supply voltage and the wordline supply voltage, respectively. In one example, VPP is the maximum positive supply voltage and VNN is the maximum negative supply voltage. However, the supply voltages may be different than illustrated in FIG. 3 (e.g., the bitline supply voltage may be negative and the wordline supply voltage may be positive, or both supply voltages can have the same polarity).

The circuit 300 also includes selection transistors (which can also be referred to as decoding transistors) between the memory cells and the supply voltages. For example, the circuit includes a global bit line selection transistor (GBL_SEL), a local bit line selection (LBL_SEL) transistor, a local word line selection transistor (LWL_SEL), and a global word line selection transistor (GWL_SEL). Turning on the selection transistors (e.g., by applying a pre-determined voltage to the gate of the transistors) selects the cell for reading or writing. In the illustrated example, the transistors GBL_SEL and LBL_SEL are connected to VPP and transistors LWL_SEL and GWL_SEL are connected to VNN. Thus, in the illustrated example, GBL_SEL and LBL_SEL are shown as PMOS transistors and LWL_SEL and GWL_SEL are shown as NMOS transistors.

Typical crosspoint memory circuit architectures include circuitry to apply a single read voltage across the cell and a single current mirror for write back after read operations. In contrast to conventional architectures, multiple read circuits enable the cell to be read at multiple read voltages to enable accurate reading of MLC crosspoint memory cells.

The circuit 300 includes transistors 306 and 308-1-308-3 to enable application of multiple read voltages across the memory cell 302. In one example, the transistors 306 and 308-1-308-3 are cascode transistors. For example, the transistor 206 on the bitline side can include a cascode transistor that passes a bias applied to the gate to its source. In this way, the voltage (e.g., BL_Read_Bias) applied to the gate of the transistor 306 can be applied to the node 307 at the source of transistor 307. Similarly, the transistors 308-1-308-3 on the wordline side can include cascode transistors to pass the voltage applied to the gate to the bulk (given that the transistors 308-1-308-3 in the illustrated example are PMOS transistors). In this way, the voltage applied to the gate of the transistors 308-1-308-3 (e.g., WL_Read_Bias_1, WL_Read_Bias_2, or WL_Read_Bias_3) can be applied to the node 309 at the drain of transistors 308-1-308-3. Regardless of the circuitry used, multiple different read voltages are to be applied across the memory cell in accordance with the techniques described herein.

For each of the different read voltages, one technique for generating the bias across the memory cell is to apply a portion of the read voltage on the bitline side and a portion of the read voltage is applied on the wordline side. For example, to cause a voltage difference of X across the memory cell 302, X/2 can be applied on the bitline side and −X/2 can be applied on the wordline side. Alternative biasing schemes can also be used. In the example illustrated in FIG. 3, the three different voltage levels (e.g., READ_BIAS_1, READ_BIAS_2, or READ_BIAS_3) are applied across the memory cell by applying a positive voltage (BL_Read_Bias) on the bitline side and a negative voltage (e.g., one of WL_Read_Bias_1, WL_Read_Bias_2, or WL_Read_Bias_3) on the wordline side via the gate of the appropriate transistor on the wordline side (e.g., 308-1 for READ_BIAS_1, 308-2 for READ_BIAS_2, and 308-3 for READ_BIAS_3). In the example illustrated in FIG. 3, the voltage generated on the bitline side can be the same for READ_BIAS_1, READ_BIAS_2, and READ_BIAS_3, and the voltage generated on the wordline side is varied depending on whether the cell is to be biased at READ_BIAS_1, READ_BIAS_2, or READ_BIAS_3. In the illustrated example, READ_BIAS_1 is equal to BL_Read_Bias+ |WL_Read_Bias_1|. READ_BIAS_2 is equal to BL_Read_Bias+|WL_Read_Bias_2|. READ_BIAS_3 is equal to BL_Read_Bias+|WL_Read_Bias_3|. Thus, the three different read biases are delivered using three different transistors (transistors 308-1, 308-2, and 308-3) to deliver three different Word-Line biases. In this example, the bitline bias is kept constant in all the three read cases. Applying a voltage to the gate of one of the transistors involves bringing the gate to the desired voltage relative to another baseline level (e.g., ground or other baseline level). Applying a voltage can involve applying a pulse or pulses or otherwise bringing the node in the circuit to the desired voltage. A current pulse is typically a rapid and transient change (e.g., increase or decrease) in voltage or current. For example, a voltage pulse may be defined as a rapid change from a first voltage level to a second voltage level, followed by a rapid return to the first voltage level. Pulses can have a variety of shapes, such as rectangular, triangular, or other shapes.

The circuit 300 also includes current mirrors 304-1, 304-2, and 304-3 for generating program current after one or more read voltages are applied across the cell. In the illustrated example, each cascode leg of the circuit is connected to a specific current mirror. Specifically, the transistor 308-1 is coupled with the current mirror 304-1, the transistor 308-2 is coupled with the current mirror 304-2, and the transistor 308-3 is coupled with the current mirror 304-3.

In one example, a current mirror will only turn on when the memory cell 302 thresholds in response to the application of the associated read voltage across the memory cell 302. For example, once the specific read bias is applied (e.g., READ_BIAS_1 and thus when WL_Read_Bias_1 is applied to the gate of the transistor 308-1), only if the memory cell 302 thresholds will there be enough bias across the current mirror 304-1 to effectively turn-on the current mirror 304-1 and then deliver the I-1 current. Similarly, when applying READ_BIAS_2 (and thus when applying WL_read_Bias_2 to the gate of the transistor 308-2), the current mirror 304-2 turns on only if the memory cell 302 thresholds in response to READ_BIAS_2. In the same way, the current mirror 304-3 turns on if the memory cell 302 thresholds in response to application of READ_BIAS_3 across the memory cell (and thus when applying WL_Read_Bias_3 to the gate of the transistor 308-3). Therefore, after the memory cell thresholds, the current path is opened and the program current (e.g., one of I-1, I-2, or I-3) is applied to the cell to bring the cell back into the prior state. Accordingly, if a read voltage causes the value stored by the cell to change (due to thresholding of the cell), a program current is automatically generated to immediately restore the state of the memory cell.

Thus, FIG. 3 illustrates one exemplary circuit in which the three sub-reads and subsequent writes are accomplished through three different cascode architectures in parallel. The circuit of FIG. 3 could be expanded to more than three cascode branches in parallel to support more than four states.

Figure 4:
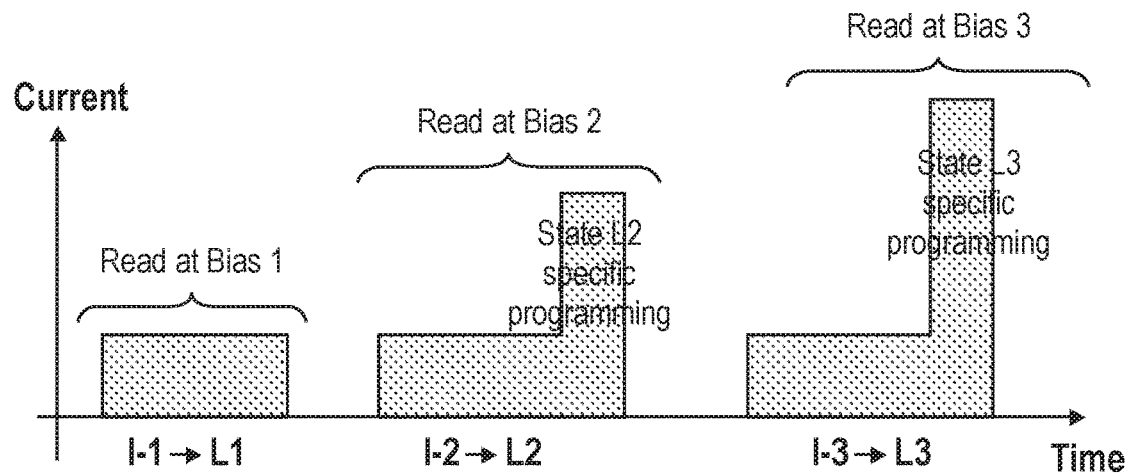
FIG. 4 illustrates an example of programming current to be used during reads.

FIG. 4 illustrates an example of programming current to be used during reads. The graph of FIG. 4 shows current versus time for reads at READ_BIAS_1, READ_BIAS_2, and READ_BIAS_3. The current I-1 is generated by the current mirror 304-1 of FIG. 3. The current I-2 is generated by the current mirror 304-2 of FIG. 3. The current I-3 is generated by the current mirror 304-3 of FIG. 3. In one example, the currents I-1, I-2, and I-3 are currents that are generated by the respective current mirrors in response to the thresholding of a cell after application of a read voltage. Note that the current waveforms illustrated in FIG. 4 are examples; other current magnitudes and current pulse shapes are possible.

Turning first to the example of the read at READ_BIAS_1, the first read voltage READ_BIAS_1 is applied across the memory cell. After application of READ_BIAS_1, the cell may or may not threshold depending on the state of the cell. If the cell is in states L2, L3, or L4, then the cell does not threshold in response to the voltage READ_BIAS_1. If the cell does not threshold, the current mirror 304-1 does not turn on. If the cell is in state L1, the cell thresholds. The current mirror 204-1 is then turned on and the current I-1 ramps up from zero to a first level to program the memory cell to the value L1. The current I-1 is then ramped down to zero as the first read completes.

If the cell did not threshold in response to READ_BIAS_1, then a second read at READ_BIAS_2 is performed. If the cell is in states L3 or L4, then the cell does not threshold in response to the voltage READ_BIAS_2. If the cell does not threshold, the current mirror 304-2 does not turn on. If the cell is in state L2, the cell thresholds. The current mirror 304-2 is then turned on and the current I-2 ramps up from zero. In the illustrated example, the memory cell is first programmed to state L1. After the cell is in state L1, the magnitude of the current is further increased to a second level to program the cell to state L2. The current I-2 is then ramped down to zero as the second read completes.

If the cell did not threshold in response to READ_BIAS_2, then a third read at READ_BIAS_3 is performed. If the cell is in state L4, then the cell does not threshold in response to the voltage READ_BIAS_3. If the cell does not threshold, the current mirror 304-3 does not turn on. If the cell is in state L3, the cell thresholds in response to READ_BIAS_3. The current mirror 304-3 is then turned on and the current I-3 ramps up from zero. In the illustrated example, the memory cell is first programmed to L1. After the cell is in state L1, the magnitude of the current is further increased to a third level to program the cell to state L3. The current I-3 is then ramped down to zero as the third read completes.

Consider an example in which the crosspoint memory cell includes a phase change storage element. If the cell is in state L1 (e.g., the cell thresholds in response to READ_BIAS_1), the I-1 programming current from the current mirror 304-1 provides current to crystallize back (set) the storage element, due to the read-disturb (e.g., a read disturb caused by the storage element transitioning to a partially amorphous state). If the memory cell is in state L2 (e.g., the cell thresholds in response to READ_BIAS_2), the I-2 programming current from the current mirror 204-1 provides the current to crystallize back (set) the storage element to state L1, and the current above the melting value to bring the cell back in state L2. If cell is in state L3 (e.g., the cell thresholds in response to READ_BIAS_3), the I-3 programming current from the current mirror 304-3 provides the current to crystallize back (set) the storage element to state L1, and the current above the melting value, (larger in magnitude than for state L2), to bring the cell back in state L3.

Figure 5:
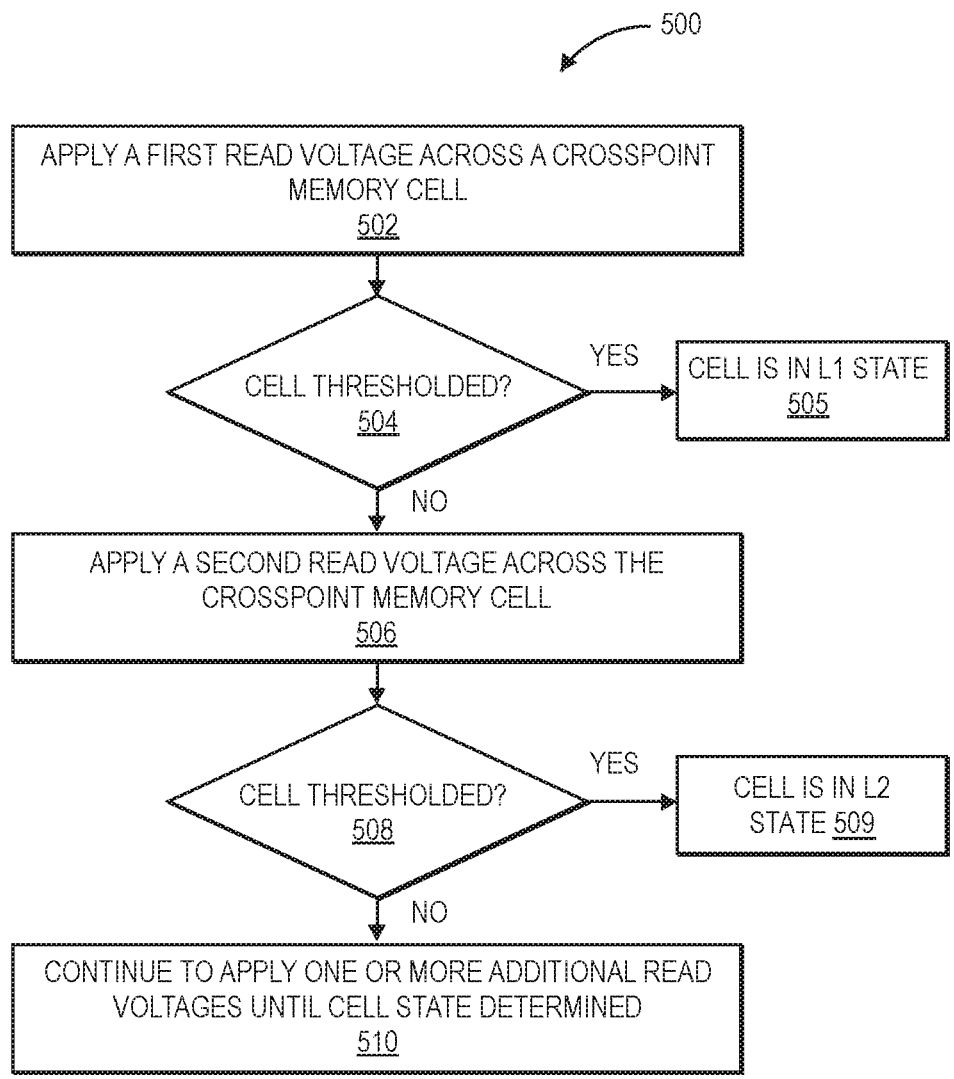
FIG. 5 is a flow diagram of an example of a method of accessing a MLC crosspoint memory cell.

FIG. 5 is a flow diagram of an example of a method of accessing a MLC crosspoint memory cell. The method 500 can be performed by hardware, firmware, or a combination of hardware and firmware.

The method 500 begins with application of a first read voltage across a crosspoint memory cell, at 502. For example, referring to FIG. 3, the voltage READ_BIAS_1 is applied across the memory cell 302. The voltage READ_BIAS_1 can be generated across the memory cell 302 by applying voltages to the gates of transistor 306 on the bitline side and 308-1 on the wordline side. The voltages can be generated by one or more voltage generation circuits coupled with the gates of the transistors 306 and 308-1. After applying the first read voltage, the method involves detecting whether the memory cell thresholded in response to the first read voltage. Detection of whether the memory cell thresholds can involve, for example, detecting whether there is current flowing through the cell (e.g., detecting whether the current through the cell has a magnitude that is greater than a threshold). For example, referring to FIG. 3, the current flowing through the memory cell 302 in response to the first read voltage can be sensed with a sense amplifier or other sense circuit.

If the memory cell did threshold in response to the first read voltage, 504 YES branch, then the state of the memory cell can be determined to be L1 without additional reads, at 505. If the memory cell did not threshold in response to the first read voltage (504 NO branch), then further reads are needed to determine the state of the memory cell. Therefore, if the memory cell did not threshold in response to the first read voltage, the method involves applying a second read voltage across the memory cell, at 506. For example, referring to FIG. 3, the voltage READ_BIAS_2 is applied across the memory cell 302. The method then involves detecting whether the memory cell thresholded in response to the second read voltage. If the memory cell thresholded in response to the second read voltage, then the state of the memory cell can be determined to be L2, at 509. If the memory cell did not threshold in response to the second read voltage (508 NO branch), the method can then continue with the application of a third read voltage, at 510. For memory cells with more than four states, the method can continue to apply additional read voltages (e.g., more than three read voltages) until the state of the memory cell can be determined. As mentioned above with respect to FIG. 2, optional write currents can be applied after one or more of the read voltages to correct any read disturb errors caused by the reads. Thus, each read operation consists of one or more consecutive sub-reads, done at different read biases. Each sub-read can also deliver a write-back current to ensure read-disturb immunity.

Figure 6:
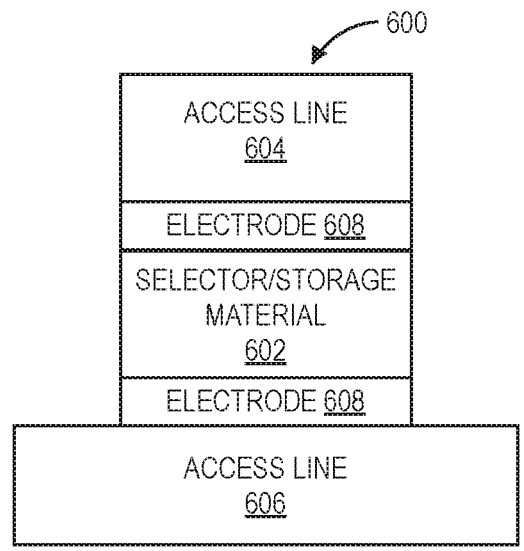
FIG. 6 is an example of a crosspoint memory cell.

FIG. 6 illustrates an example of a crosspoint memory cell that can be accessed using techniques described herein.

FIG. 6 illustrates a memory cell 600. The memory cell 600 includes one or more layers of material 602 to store data and aid in selection of the memory cell 100. For example, the memory cell 600 can include a storage material 602, a selector material, or both, between access lines 604 and 606.

In one example, the memory cell includes a layer of storage material and a separate layer of selector material. In one example, the selector is a device with a threshold voltage and the storage element is a device with a tunable threshold voltage. In one example, the memory cell 600 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation).

The techniques described herein apply generally to crosspoint memory and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a selector device. The selector material may include a chalcogenide material (e.g., a chalcogenide glass) or other material capable of operating as a selection element. In one example, the selector material includes one or more of: silicon (Si), germanium (Ge), selenium (Se), arsenic, tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 604, 606 electrically couple the memory cell 100 with circuitry that provides power to and enables access to the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 604, 606 can be referred to as a bit line and word line, respectively. The word line is for accessing a particular word in a memory array and the bit line is for accessing a particular bit in the word. The access lines 604, 606 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 608 are disposed between storage material 602 and access lines 604, 606. Electrodes 608 electrically couple access lines 604, 606 with storage material 602. A memory cell with separate layers of storage and selector material may also include an electrode between the layers of storage and selector material. Electrodes 608 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 7:
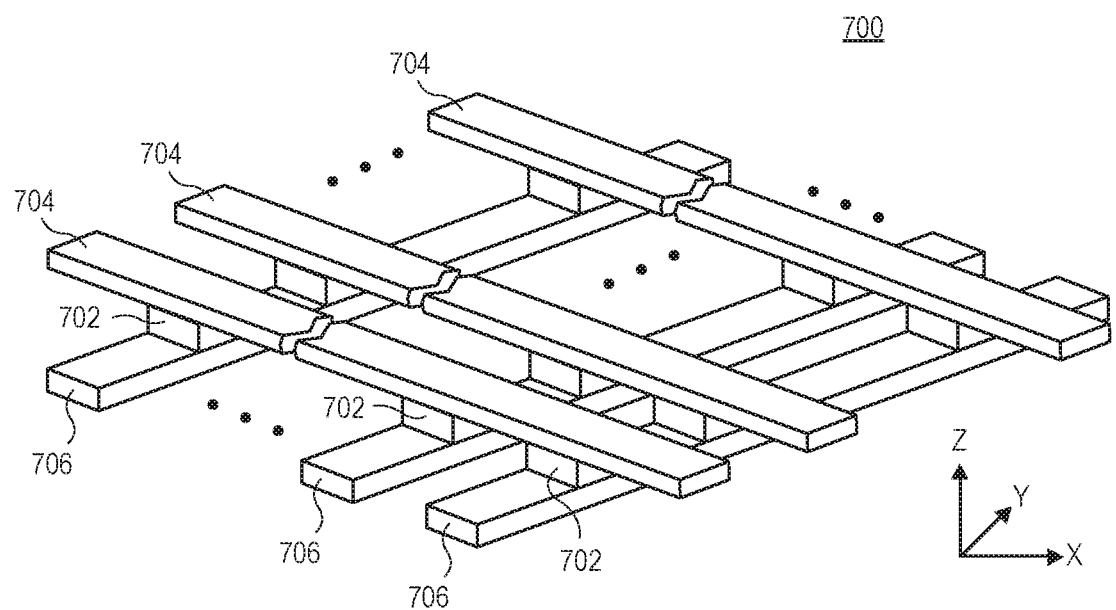
FIG. 7 illustrates an example of a portion of a memory cell array.

FIG. 7 illustrates a portion of a memory cell array 700, which can include a memory cell such as the memory cell 106 of FIG. 1 or memory cell 600 of FIG. 6. The memory cell array 700 is an example of a cross-point memory array. The memory cell array 700 includes a plurality of access lines 704, 706, which can be the same or similar as the access lines 604, 606 described with respect to FIG. 6. Access lines 704, 706 can be referred to as bit lines and word lines. In the example illustrated in FIG. 7, the bit lines (e.g., access lines 704) are orthogonal to the word lines (e.g., access lines 706). A storage material 702 is disposed between the access lines 704, 706. In one example, a "cross-point" is formed at an intersection between a bit line, a word line. A memory cell is created from the storage material 702 between the bit line and word line where the bit line and word line intersect. The storage material 702 can be a chalcogenide material, phase change material, both a chalcogenide material and phase change material, or other storage material. In one example, the access lines 704, 706 are composed of one or more conductive materials such as the access lines 604, 606 described above with respect to FIG. 6.

Although a single level or tier of memory cells is shown in FIG. 7 for the sake of clarity, memory cell array 700 typically includes multiple levels or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The FIGS. 6 and 7 illustrate an example of a memory cell and array in which the multi-level cell (MLC) techniques described herein may be implemented. However, the programming techniques described herein can be implemented in memory cell structures and arrays having different materials or structures than the examples described in FIGS. 6 and 7.

Figure 8:
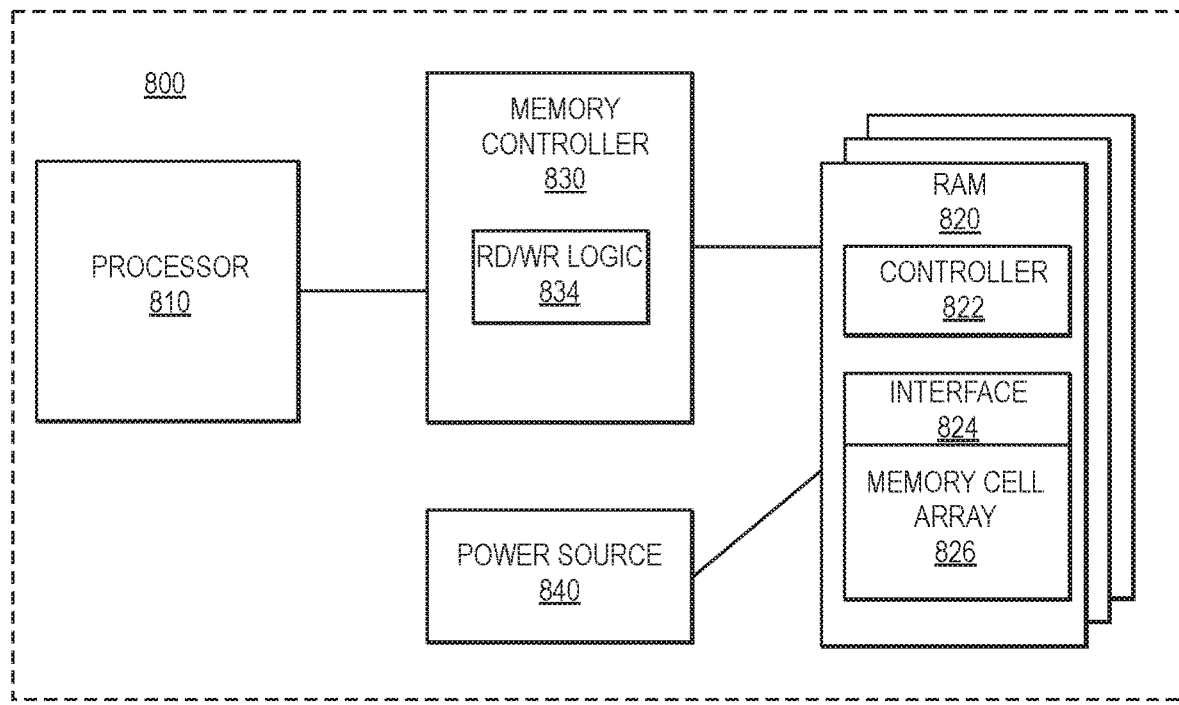
FIG. 8 is a block diagram of a system that can include a non-volatile memory device that implements MLC access techniques described herein.

FIG. 8 is a block diagram of a system that can include a non-volatile memory device in accordance with examples described herein.

System 800 includes components of a memory subsystem having random access memory (RAM) 820 to store and provide data in response to operations of processor 810. The system 800 receives memory access requests from a host or a processor 810, which is processing logic that executes operations based on data stored in RAM 820 or generates data to store in RAM 820. The processor 810 can be or include a host processor, central processing unit (CPU), microcontroller or microprocessor, graphics processor, peripheral processor, application specific processor, or other processor, and can be single core or multicore.

The system 800 includes a memory controller 830, which represents logic to interface with RAM 820 and manage access to data stored in the memory. In one example, the memory controller 830 is integrated into the hardware of processor 810. In one example, the memory controller 830 is standalone hardware, separate from the processor 810. The memory controller 830 can be a separate circuit on a substrate that includes the processor. The memory controller 830 can be a separate die or chip integrated on a common substrate with a processor die (e.g., as a system on a chip (SoC)). In one example, the memory controller 830 is an integrated memory controller (iMC) integrated as a circuit on the processor die. In one example, at least some of RAM 820 can be included on an SoC with the memory controller 830 and/or the processor 810.

In the illustrated example, the memory controller 830 includes read/write logic 834, which includes hardware to interface with the RAM 820. The logic 834 enables the memory controller 830 to generate read and write commands to service requests for data access generated by the execution of instructions by processor 810.

The memory resources or cachelines in the RAM 820 are represented by a memory cell array 826, which can include a cross-point array. The RAM 820 includes an interface 824 (e.g., interface logic) to control the access to the memory device array 826. The interface 824 can include decode logic, including logic to address specific rows or columns, bit lines or word lines, or otherwise address specific bits of data. The controller 822 represents an on-die controller on RAM 820 to control its internal operations to execute commands received from memory controller 830. For example, the controller 822 can control any of timing, voltage levels, addressing, I/O (input/output) margining, scheduling, and error correction for RAM 820.

In one example, the controller 822 is configured to read and write to the memory device array 826 (e.g., via set and reset operations) in accordance with any example described herein. A power source 840 is connected to the RAM 820 to provide one or more voltage rails for operation of the RAM 820.

Figure 9:
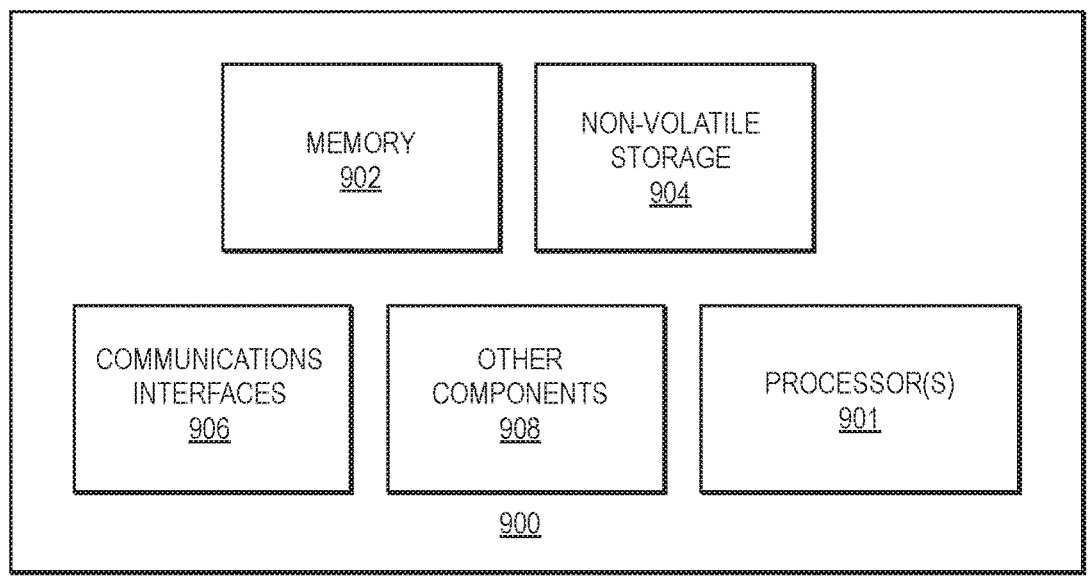
FIG. 9 provides an exemplary depiction of a computing system that can include a non-volatile memory device that implements MLC access techniques described herein.

FIG. 9 provides an exemplary depiction of a computing system 900 (e.g., a smartphone, a tablet computer, a laptop computer, a desktop computer, a server computer, etc.). As observed in FIG. 9, the system 900 may include one or more processors or processing units 901. The processor(s) 901 may include one or more central processing units (CPUs), each of which may include, e.g., a plurality of general-purpose processing cores. The processor(s) 901 may also or alternatively include one or more graphics processing units (GPUs) or other processing units. The processor(s) 901 may include memory management logic (e.g., a memory controller) and I/O control logic. The processor(s) 901 can be similar to, or the same as, the processor 810 of FIG. 8.

The system 900 also includes memory 902 (e.g., system memory), non-volatile storage 904, communications interfaces 906, and other components 908. The other components may include, for example, a display (e.g., touchscreen, flat-panel), a power supply (e.g., a battery or/or other power supply), sensors, power management logic, or other components. The communications interfaces 906 may include logic and/or features to support a communication interface. For these examples, communications interface 906 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 904, which may be the mass storage component of the system. The non-volatile storage 904 can be similar to, or the same as, the RAM 820 of FIG. 8, described above. Non-volatile storage 904 may include byte or block addressable types of non-volatile memory having a cross-point memory structure. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 904 may include mass storage that is composed of one or more SSDs (solid state drives), DIMMs (dual in line memory modules), or other module or drive. The non-volatile storage 904 may include MLC memory cells and implement techniques for accessing the MLC memory cells in accordance with examples described herein.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a crosspoint memory cell, the crosspoint memory cell to be in one of multiple resistive states; and
circuitry coupled with the crosspoint memory cell, the circuitry to:
apply a first read voltage across the crosspoint memory cell,
detect whether the crosspoint memory cell thresholded in response to the first read voltage;
in response to detection that the crosspoint memory cell did not threshold in response to the first read voltage, apply a second read voltage across the crosspoint memory cell;
in response to detection that the crosspoint memory cell did not threshold in response to the second read voltage, apply a third read voltage across the crosspoint memory cell; and
wherein the circuitry includes:
a first current mirror to apply a first program current after application of the first read voltage if the crosspoint memory cell thresholded in response to the first read voltage,
a second current mirror to apply a second program current after application of the second read voltage if the crosspoint memory cell thresholded in response to the second read voltage, and
a third current mirror to apply a third program current after application of the third read voltage if the crosspoint memory cell thresholded in response to the third read voltage.

2. The memory device of claim 1, wherein:
the circuitry is to:
detect whether the crosspoint memory cell thresholded in response to the second read voltage; and
in response to detection that the crosspoint memory cell did not threshold in response to the second read voltage, apply a third read voltage across the crosspoint memory cell.

3. The memory device of claim 1, wherein:
the circuitry to detect whether the crosspoint memory cell thresholded is to: detect that the crosspoint memory cell thresholded if current through the crosspoint memory cell has a magnitude that is greater than a threshold.

4. The memory device of claim 1, wherein:
the circuitry is to:
determine the crosspoint memory cell stored a first logic value if the crosspoint memory cell thresholded in response to the first read voltage, and
determine the crosspoint memory cell stored a second logic value if the crosspoint memory cell thresholded in response to the second read voltage.

5. The memory device of claim 2, wherein:
the circuitry is to:
determine the crosspoint memory cell stored a third logic value if the crosspoint memory cell thresholded in response to the third read voltage, and
determine the crosspoint memory cell stored a fourth logic value in response if the crosspoint memory cell did not threshold in response to the third voltage.

6. The memory device of claim 2, wherein:
the second read voltage has a larger magnitude than the first read voltage; and
the third read voltage has a larger magnitude than the second read voltage.

7. The memory device of claim 1, wherein:
one or both of the first read voltage and the second read voltage have magnitudes greater than a threshold voltage of the crosspoint memory cell.

8. The memory device of claim 1, wherein:
the crosspoint memory cell is to be in one of four resistive states.

9. The memory device of claim 1, wherein:
The crosspoint memory cell comprises a layer of selector material and a layer of storage material; and
wherein the layer of storage material is to be in one of multiple resistive states.

10. The memory device of claim 1, wherein:
the crosspoint memory cell comprises a layer of selector material and a layer of storage material; and
wherein both the selector material and the storage material are to be in one of multiple resistive states.

11. The memory device of claim 1, wherein:
the memory cell comprises a layer of self-selecting storage material to be in one of multiple resistive states.

12. The memory device of claim 9, wherein:
the storage material comprises a phase change material to be in one of four states having varying degrees of amorphousness or crystallinity.

13. A circuit comprising:
circuitry coupled with a crosspoint memory cell, the circuitry including:
a voltage generation circuit to apply a first read voltage across the crosspoint memory cell, and
a sense circuit to detect whether the crosspoint memory cell thresholded in response to the first read voltage;
wherein the voltage generation circuit is to:
in response to detection that the crosspoint memory cell did not threshold in response to the first read voltage, apply a second read voltage across the crosspoint memory cell, and in response to detection that the crosspoint memory cell did not threshold in response to the second read voltage, apply a third read voltage across the crosspoint memory cell; and
a first current mirror to apply a first program current after application of the first read voltage if the crosspoint memory cell thresholded in response to the first read voltage;
a second current mirror to apply a second program current after application of the second read voltage if the crosspoint memory cell thresholded in response to the second read voltage; and
a third current mirror to apply a third program current after application of the third read voltage if the crosspoint memory cell thresholded in response to the third read voltage.

14. The circuit of claim 13, wherein:
the sense circuit is to detect whether the crosspoint memory cell thresholded in response to the second read voltage; and
the voltage generation circuit is to, in response to detection that the crosspoint memory cell did not threshold in response to the second read voltage, apply a third read voltage across the crosspoint memory cell.

15. The circuit of claim 13, wherein:
the sense circuit to detect whether the crosspoint memory cell thresholded is to: detect that the crosspoint memory cell thresholded if current through the crosspoint memory cell has a magnitude that is greater than a threshold.

16. A system comprising:
a memory controller; and
a crosspoint memory device coupled with the memory controller, the crosspoint memory device including:
an array of crosspoint memory cells, a crosspoint memory cell of the array to be in one of multiple resistive states; and
circuitry coupled with the crosspoint memory cell, the circuitry to:
apply a first read voltage across the crosspoint memory cell,
detect whether the crosspoint memory cell thresholded in response to the first read voltage;
in response to detection that the crosspoint memory cell did not threshold in response to the first read voltage, apply a second read voltage across the crosspoint memory cell;
in response to detection that the crosspoint memory cell did not threshold in response to the second read voltage, apply a third read voltage across the crosspoint memory cell; and
wherein the circuitry includes:
a first current mirror to apply a first program current after application of the first read voltage if the crosspoint memory cell thresholded in response to the first read voltage,
a second current mirror to apply a second program current after application of the second read voltage if the crosspoint memory cell thresholded in response to the second read voltage, and
a third current mirror to apply a third program current after application of the third read voltage if the crosspoint memory cell thresholded in response to the third read voltage.

17. The system of claim 16, further comprising:
one or more of the following coupled with the memory device: a processor, a power supply, and a display.

* * * * *